(12) United States Patent
Kang et al.

(10) Patent No.: US 9,190,580 B2
(45) Date of Patent: Nov. 17, 2015

(54) PHOSPHOR AND LIGHT EMITTING DEVICE HAVING THE SAME

(71) Applicant: LG INNOTEK CO., LTD., Seoul (KR)

(72) Inventors: Hyun Goo Kang, Seoul (KR); Ki Ho Hong, Seoul (KR); Ji Wook Moon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/071,014

(22) Filed: Nov. 4, 2013

(65) Prior Publication Data

US 2014/0124811 A1     May 8, 2014

(30) Foreign Application Priority Data

Nov. 5, 2012   (KR) ........................ 10-2012-0124305

(51) Int. Cl.
| | | |
|---|---|---|
| C09K 11/80 | (2006.01) | |
| C09K 11/79 | (2006.01) | |
| H01L 33/50 | (2010.01) | |
| C09K 11/77 | (2006.01) | |
| C09K 11/08 | (2006.01) | |
| C04B 35/597 | (2006.01) | |

(52) U.S. Cl.
CPC ............ *H01L 33/502* (2013.01); *C04B 35/597* (2013.01); *C09K 11/0883* (2013.01); *C09K 11/7774* (2013.01); *C09K 11/7792* (2013.01); *C04B 2235/3225* (2013.01); *C04B 2235/3229* (2013.01); *H01L 2224/48091* (2013.01); *H01L 2224/48247* (2013.01)

(58) Field of Classification Search
CPC ........................ C09K 11/7774; C09K 11/0883
USPC ..................................................... 252/301.4 F
See application file for complete search history.

(56) References Cited

U.S. PATENT DOCUMENTS

| | | | |
|---|---|---|---|
| 8,471,459 B2 * | 6/2013 | Kato et al. .................... 313/503 |
| 2006/0186377 A1 | 8/2006 | Takahashi et al. |
| 2006/0192178 A1 | 8/2006 | Hirosaki |
| 2007/0278930 A1 | 12/2007 | Takahashi et al. |
| 2008/0203892 A1 | 8/2008 | Schmidt et al. |
| 2009/0021141 A1 | 1/2009 | Emoto et al. |
| 2011/0058583 A1 | 3/2011 | Fukuda et al. |

FOREIGN PATENT DOCUMENTS

| | | |
|---|---|---|
| EP | 2 003 183 B1 | 8/2012 |
| EP | 1 854 864 B1 | 11/2012 |
| JP | 2008-195779 A | 8/2008 |
| WO | WO 2005/019376 A | 3/2005 |
| WO | WO 2006/095284 A1 | 9/2006 |

* cited by examiner

*Primary Examiner* — Carol M Koslow
(74) *Attorney, Agent, or Firm* — Birch, Stewart, Kolasch & Birch, LLP (57) ABSTRACT

Disclosed are a phosphor and a light emitting device including the same. The light emitting device includes a light emitting chip, a phosphor layer on the light emitting chip, and a phosphor added into the phosphor layer to absorb a light emitted from the light emitting chip and emit a central wavelength having a first blue color. The phosphor has a composition formula of $La_xO_ySi_6Al_4N_{12}:Ce^{3+}_z$, a range of the x is $2 \leq x \leq 8$, and a range of the y is $3 \leq y \leq 12$.

7 Claims, 7 Drawing Sheets

PHOSPHOR AND LIGHT EMITTING DEVICE HAVING THE SAME

CROSS-REFERENCE TO RELATED APPLICATIONS

The present application claims priority under 35 U.S.C. §119(a) of Korean Patent Application No. 10-2012-0124305 filed on Nov. 5, 2012, which is hereby incorporated by reference in its entirety.

BACKGROUND

The embodiment relates to a phosphor and a light emitting device having the same. The light emitting device may be included in a lighting system.

A LED (Light Emitting Device) is a device having a property of converting electrical energy into light energy. For example, the LED may represent various colors by adjusting the compositional ratio of compound semiconductors.

For instance, a nitride semiconductor represents superior thermal stability and wide bandgap energy so that the nitride semiconductor has been spotlighted in the field of optical devices and high-power electronic devices. In particular, blue, green, and UV light emitting devices employing the nitride semiconductor have already been commercialized and extensively used.

A LED of emitting white color light, which employs a secondary light source of emitting light by coating phosphor, is generally implemented through a scheme of coating YAG:Ce phosphor of generating yellow color light on a blue LED.

However, according to the scheme described above, due to quantum deficits and reradiation efficiency caused by secondary light, the efficiency is degraded and the color rendering is not easy.

Thus, since a white LED backlight according to the related art has the combination of a blue LED and a yellow phosphor, the white LED backlight lacks of green and red components, so that colors are unnaturally represented. For this reason, the white LED backlight has been limitedly applied to a display of a cellular phone or a laptop computer. Nevertheless, the white LED backlight according to the related art has been extensively used because the white LED backlight is easily driven and remarkably inexpensive.

Generally, it is well known in the art that the phosphor material may include a silicate, a phosphate, an aluminate, or a sulfide and a transition metal or a rare earth metal is used at the center of light emission. For example, although silicate phosphor has been used for a backlight unit or a lighting device, the silicate phosphor is weak to moisture so the reliability of the silicate phosphor is inferior to any other phosphors.

Meanwhile, although a phosphor for a white LED, which is excited by an excitation source having high energy such as ultraviolet light or blue light to emit visible light, has been mainly developed, if the phosphor according to the related art is exposed to the excitation source, the luminance of the phosphor is reduced.

SUMMARY

The embodiment provides a blue phosphor having novel composition and a light emitting device including the same.

In addition, the embodiment provides a phosphor having improved reliability and representing high brightness and a light emitting device including the same.

In addition, the embodiment provides a phosphor representing high luminescence intensity and a light emitting device including the same.

According to the embodiment, there is provided a phosphor expressed by a composition formula of AxOyMCG:RE3+z. The A includes at least one selected from the group consisting of La, Y, Sc, Gd, and Lu, the M includes at least one selected from the group consisting of Si, Ge, and Sn, the C includes at least one selected from the group consisting of B, Al, Ga, and In, the O includes an oxygen element, the G includes a nitrogen element, the RE includes at least one selected from the group consisting of Ce, Sm, Eu, Yb, Dy, Gd, Tm, and Lu, and the x is in a range of $2<x<8$, the y is in a range of $3<y<12$, and the z is in a range of $0<z<0.75$ to emit a central wavelength in the blue light.

According to the embodiment, there is provided a light emitting device including a light emitting chip, a phosphor layer on the light emitting chip, and a phosphor added into the phosphor layer to absorb a light emitted from the light emitting chip and emit a central wavelength of a first blue color. The phosphor has a composition formula of $La_xO_ySi_6Al_4N_{12}:Ce^{3+}_z$, the x is in a range of $2\leq x\leq 8$, and the y is in a range $3\leq y\leq 12$.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

(Embodiment)

Figure 1:
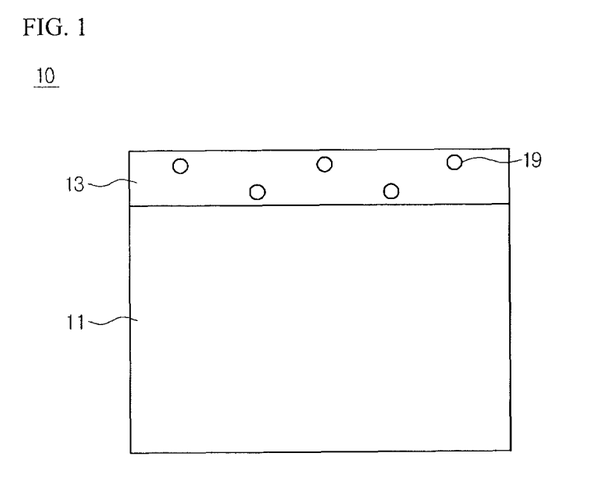
FIG. 1 is a sectional view showing a first light emitting device including a phosphor according to the embodiment.

FIG. 1 is a sectional view showing a light emitting device 10 including a phosphor according to the embodiment. The light emitting device 10 is not limited thereto, and various embodiments are applicable to the light emitting device 10.

Referring to FIG. 1, the light emitting device 10 includes a light emitting chip 11 and a phosphor layer 13. The light emitting chip 11 serves as a light source and may include an LED chip to emit visible light wavelengths. The visible light wavelengths may be in the range of 300 nm to 400 nm, for example, the range of 350 nm to 370 nm The light emitting chip 11 may include an LED chip including at least one of a compound semiconductor including group III to V elements and a compound semiconductor including group II to VI elements. For example, the light emitting chip 11 may include at least one selected from the group consisting of GaN, InN, MN, InGaN, AlGaN, InAlGaN, AlInN, GaN, GaAs, GaAsP, and GaP. In addition, the LED chip may include a compound semiconductor having a composition formula of $Al_xIn_yGa_{(1-x-y)}N$ (where $0 \le x \le 1$, $0 \le y \le 1$, and $0 \le x+y \le 1$). The light emitting chip 11 may include a plurality of compound semiconductor layers including the lamination structure of an N type semiconductor layer, an active layer, and a P type semiconductor layer, and may have a vertical-type electrode structure in which an N type electrode is opposite to a P type electrode, and a lateral-type electrode structure in which the N type electrode is parallel to the P type electrode. Alternatively, one of the N type electrode and the P type electrode may have a via electrode structure. The light emitting chip 11 may include a plurality of compound semiconductor layers including a lamination structure of an N type semiconductor layer, an active layer, and a P type semiconductor layer.

The phosphor layer 13 includes a phosphor 19 according to the embodiment contained in a transmittance resin material such as silicon or epoxy. The phosphor 19 is a blue phosphor, and the blue phosphor emits a blue wavelength having the central wavelength in the range of 460 nm to 475 nm In detail, the blue phosphor emits a blue wavelength having the central wavelength in the range of 465 nm to 473 nm.

The phosphor 19 is expressed through the composition having the formula of $AOMCG:RE^{3+}_z$. In this case, "A" of $AOMCG:RE^{3+}$, includes at least one selected from the group consisting of La, Y, Sc, Gd, and Lu, "M" of $AOMCG:RE^{3+}$, includes at least one selected from the group consisting of Si, Ge, and Sn, "C" of $AOMCG:RE^{3+}$, represents at least one selected from the group consisting of B, Al, Ga, and In, "O" of $AOMCG:RE^{3+}_z$, includes an oxygen element, "G" of $AOMCG:RE^{3+}_z$, includes a nitrogen element, and "RE" of $AOMCG:RE^{3+}_z$, includes at least one selected from the group consisting of Eu, Ce, Sm, Eu, Yb, Dy, Gd, Tm, and Lu serving as rare earth elements. In this case, "z" of $AOMCG:RE^{3+}_z$, may be optimally varied, for example, varied in the range of $0<z \le 0.75$. The phosphor 19 includes the composition of the above elements to define a phosphor composition, but the embodiment is not limited thereto.

The phosphor 19 according to the embodiment has the compositional formula of $La_xO_ySi_6Al_4N_{12}:Ce^{3+}_z$, x may be in the range of $2 \le x \le 8$, and y may be in the range of $3 \le y \le 12$. In addition, z may be in the range of $0.25 \le z \le 0.75$.

The phosphor 19 according to the embodiment may absorb the central wavelength of a visible light range emitted from the light emitting chip 11. For example, the phosphor 19 may absorb the central wavelength in the range of 350 nm to 370 nm and emit the central wavelength in the range of 465 nm to 473 nm.

The phosphor layer 13 may further include at least one of other phosphors such as a red phosphor, a green phosphor, and a yellow phosphor. For example, the phosphor layer 13 may include green and red phosphors to emit white color light.

Alternatively, the light emitting chip 11 may emit the blue wavelength having the central wavelength of 450 nm or less. For example, the light emitting chip 11 may emit the central wavelength in the range of 400 nm to 435 nm. The phosphor 19 may emit the central wavelength in the range of 465 nm to 473 nm with respect to the central wavelength in the range of 400 nm to 435 nm. The spectrum range of the blue wavelength may be widened by the first blue wavelength of the light emitting chip 11 and the second blue wavelength of the phosphor 19.

Figure 2:
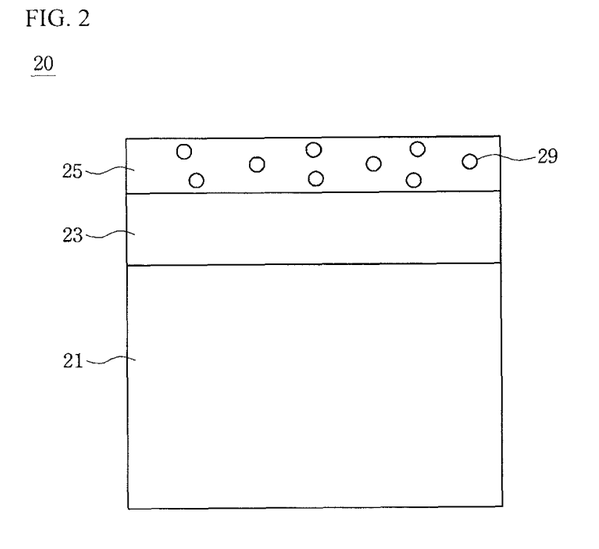
FIG. 2 is a sectional view showing a second light emitting device including a phosphor according to the embodiment.

FIG. 2 is a sectional view showing a light emitting device according to the second embodiment. Hereinafter, the second embodiment will be described by making reference to the description of the first embodiment with respect to the same components and structure as those of the first embodiment.

Referring to FIG. 2, a light emitting device 20 includes a light emitting chip 21, a diffusion layer 23 on the light emitting chip 21, and a phosphor layer 25 on the diffusion layer 23.

The light emitting chip 21 emits the central wavelength in the range of 300 nm to 400 nm, for example, the range of 350 nm to 370 nm among visible light wavelengths. The phosphor layer 25 may include a phosphor 29 according to the embodiment, for example, a blue phosphor. The blue phosphor absorbs the central wavelength in the range of 350 nm to 370 nm emitted from the light emitting chip and emit the central wavelength in the range of 465 nm to 473 nm. In addition, the phosphor layer 25 may further include other phosphors. For example, the phosphor layer 25 may further include at least one of green, red, and yellow phosphors.

The diffusion layer 23 may be interposed between the light emitting chip 21 and the phosphor layer 25 to diffuse light emitted from the light emitting chip 21. The diffusion layer 23 may include a medium such as air, a medium having a refractive index of at least 1, or a transmittance resin material such as silicon or epoxy. The diffusion layer 23 is a layer having no any impurity. For example, the diffusion layer 23 may be a transparent layer having no impurity such as a diffusion agent or a scattering agent.

Alternatively, the light emitting chip 21 may emit the blue wavelength having the central wavelength of 450 nm or less. For example, the light emitting chip 21 may emit the central wavelength in the range of 400 nm to 435 nm. The phosphor 19 may emit the central wavelength in the range of 465 nm to 473 nm with respect to the central wavelength in the range of 400 nm to 435 nm.

Figure 3:
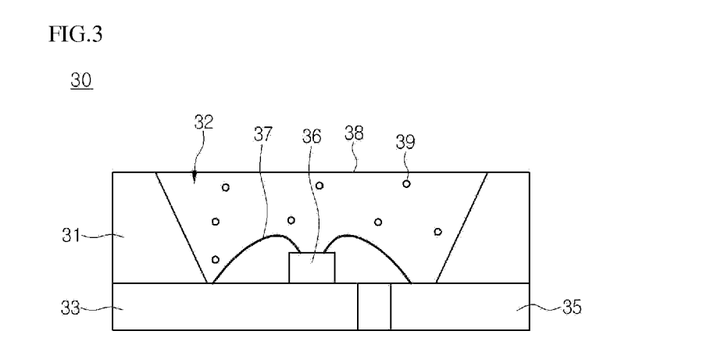
FIG. 3 is a sectional view showing a third light emitting device including a phosphor according to the embodiment.

FIG. 3 is a sectional view showing a light emitting device 30 according to the third embodiment.

Referring to FIG. 3, the light emitting device 30 includes a body 31, first and second lead frames 33 and 35, a light emitting chip 36, and a phosphor layer 38 having a phosphor 39 according to the embodiment.

The body 31 may include a material representing transmittance higher than reflectance with respect to a wavelength emitted by the light emitting chip 36. For example, the body 31 may include at least 70% of reflectance. If the body 31 represents at least 70% of reflectance, a material constituting the body 31 may include a non-transmittive material. The body 31 may include a resin-based insulating material. For example, the body 31 may include a resin material such as polyphthalamide (PPA). The body 31 may include thermosetting resin including a silicon-based material, an epoxy-based material, or a plastic material, or a high heat resistance material, or a high light resistance material. The silicon includes white-color-based resin. In addition, the body 31 may selectively include acid anhydride, an antioxidant, a release agent, an optical reflector, an inorganic filling agent, a curing catalyst, a light stabilizer, a lubricant, or a titanium dioxide. The body 31 may be molded by using at least one selected from the group consisting of epoxy resin, modified epoxy resin, silicon resin, modified silicon resin, acrylic resin, and urethane resin. For example, the body 31 can be formed by using B-stage solid epoxy resin composition, which can be obtained by mixing the epoxy resin, such as triglycidylisocyanurate or hydride bisphenol A diglycidylether, with the acid anhydride promoter, such as hexahydro phthalic anhydride, 3-methyl hexahydro phthalic anhydride or 4-methyl hexahydro phthalic anhydride, and then partially hardening the mixture after adding DBU(1.8-Diazabicyclo(5,4,0)undecene-7) serving as a hardening accelerator and ethylene glycol, titanium oxide pigment or glass fiber serving as a promoter to the epoxy resin, but the embodiment is not limited thereto.

In addition, a light shielding material or a dispersing agent is added in the body 31 to reduce light transmitted through the body 31. In addition, the body 31 may include at least one selected from the group consisting of a dispersing agent, pigments, phosphors, reflective materials, light shielding materials, a light stabilizer, and a lubricant mixed with thermal setting resin.

The body 31 may include a metal oxide added to a resin material such as epoxy or silicon, and the metal oxide may include at least one of $TiO_2$, $SiO_2$, and $Al_2O_3$, and may be added with the content of 3 wt % or more into the body 10. Accordingly, the body 31 may effectively reflect incident light. In this case, if the content of the metal oxide added into the body 31 is 3 wt % or less, the reflection efficiency may be degraded. If the reflection efficiency is degraded, the distribution of the light orientation angle may be varied. Alternatively, the body 31 may include a resin material representing transmittance or a resin material having the phosphor according to the embodiment to convert the wavelength of incident light.

The body 31 includes a concave part 32 open at a predetermined depth. The concave part 32 may be formed in a shape such as a concave cup structure, a cavity structure, or a recess structure, but the embodiment is not limited thereto.

The body 31 is provided therein with the first and second lead frames 33 and 35, and the first and second lead frames 33 and 35 may be provided on the bottom surface of the concave part 32, but the embodiment is not limited thereto. Lower portions of the first and second lead frames 33 and 35 may be exposed to the lower portion of the body 31, but the embodiment is not limited thereto. The first and second lead frames 33 and 35 may include at least one of metallic materials such as titanium (Ti), copper (Cu), nickel (Ni), gold (Au), chrome (Cr), tantalum (Ta), platinum (Pt), zinc (Sn), silver (Ag), and phosphor (P), and may be formed in a single metal layer, or a multi-metal layer. The first and second lead frames 33 and 35 may have the thicknesses of 0.15 mm or more, for example, the thicknesses of 0.18 mm.

Alternatively, at least one of the first and second lead frames 33 and 35 may be formed in a concave-cup-shaped structure, or a bent shape, or may include a recessed groove for the coupling with the body 31, but the embodiment is not limited thereto.

The light emitting chip 36 is provided on the first lead frame 33. The light emitting chip 36 adheres to the first lead frame 33 by using a bonding member (not shown). The light emitting chip 36 may be connected with at least one of the first and second lead frames 33 and 35 by using a wire 37, but the embodiment is not limited thereto.

The light emitting chip 36 emits the central wavelength in the range of 300 nm to 400 nm, for example, the range of 350 nm to 370 nm among visible light wavelengths.

The concave part 32 is provided therein with the phosphor layer 38, and the phosphor layer 38 includes the phosphor 39 according to the embodiment. The phosphor 39 may include a blue phosphor. The phosphor 39 including the blue phosphor may absorb the central wavelength in the range of 350 nm to 370 nm emitted from the light emitting chip 36 and emit the central wavelength in the range of 465 nm to 473 nm. In addition, the phosphor layer 38 may further include other phosphors. For example, the phosphor layer 38 may further include at least one of green, red, and yellow phosphors.

The light emitting device 30 may be additionally provided thereon with optical members such as an optical lens, a light guide plate, and an optical sheet, but the embodiment is not limited thereto.

Alternatively, the light emitting chip 36 may emit the blue wavelength having the central wavelength of 450 nm or less. For example, the light emitting chip 36 may emit the central wavelength in the range of 400 nm to 435 nm. The phosphor 39 may emit the central wavelength in the range of 465 nm to 473 nm with respect to the central wavelength in the range of 400 nm to 435 nm.

Figure 4:
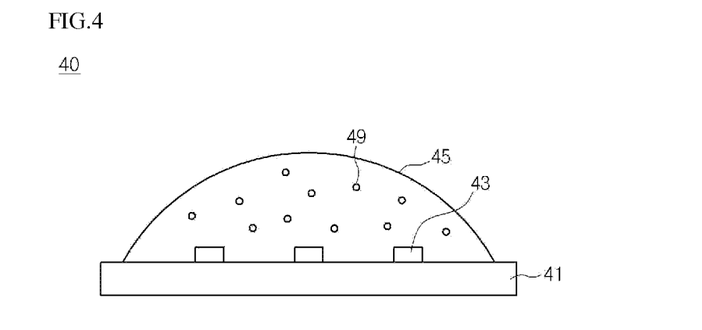
FIG. 4 is a sectional view showing a fourth light emitting device including a phosphor according to the embodiment.

FIG. 4 is a sectional view showing a light emitting device according to a fourth embodiment.

Referring to FIG. 4, the light emitting device 40 includes a substrate 41, a plurality of light emitting chips 43 mounted on the substrate 41, and a phosphor layer 45 which has the phosphor 49 according to the embodiment and covers the light emitting chip 43.

The substrate 41 includes one of a printed circuit board (PCB), which includes a circuit pattern (not shown) and a resin material, a metal core PCB (MCPCB), a flexible PCB (FPCB), and a ceramic material, but the embodiment is not limited thereto.

The light emitting chips 43 are arranged on the substrate 41, and may be connected with each other in series or in parallel. At least one of the light emitting chips 43 emits the central wavelength in the range of 300 nm to 400 nm, for example, 350 nm to 370 nm among the visible light wavelength range.

The phosphor layer 45 may include the phosphor 49 according to the embodiment, for example, a blue phosphor. The blue phosphor may absorb the central wavelength in the range of 350 nm to 370 nm emitted from the light emitting chip 43 and emit the central wavelength in the range of 465 nm to 473 nm In addition, the phosphor layer 45 may further include other phosphors. For example, the phosphor layer 45 may further include at least one of green, red, and yellow phosphors.

The phosphor 49 according to the embodiment has the compositional formula of $La_xO_ySi_6Al_4N_{12}:Ce^{3+}_z$, x may be in the range of $2 \leq x \leq 8$, y may be in the range of $3 \leq y \leq 12$, and z may be in the range of $0.25 \leq z \leq 0.75$. The phosphor 49 according to the embodiment may absorb the central wavelength of a visible light range emitted from the light emitting chip 43. For example, the phosphor 49 may absorb the central wavelength in the range of 350 nm to 370 nm and emit the central wavelength in the range of 465 nm to 473 nm.

At least one of the light emitting chips 43 may selectively include red, blue, green, and yellow-green LED chips instead of an ultraviolet LED chip.

Figure 5:
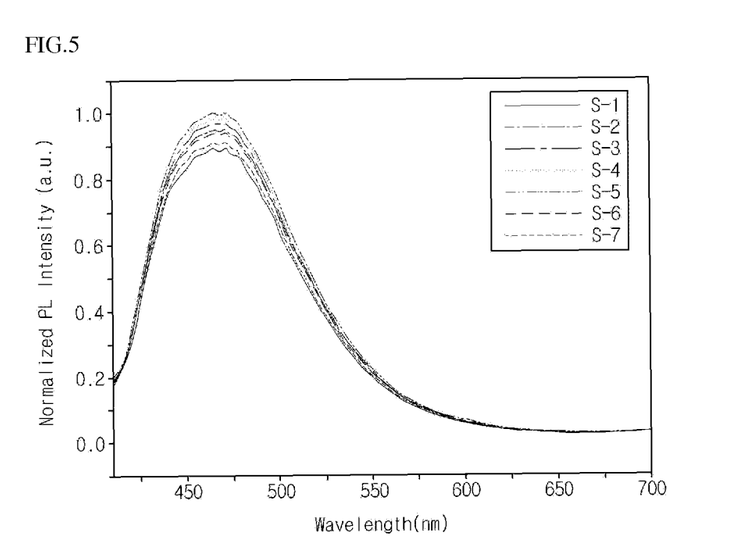
FIG. 5 is a graph showing the comparison between characteristic data of light emitting wavelengths varying depending on the compositional ratios of LaO in the phosphor according to the embodiment.
Figure 6:
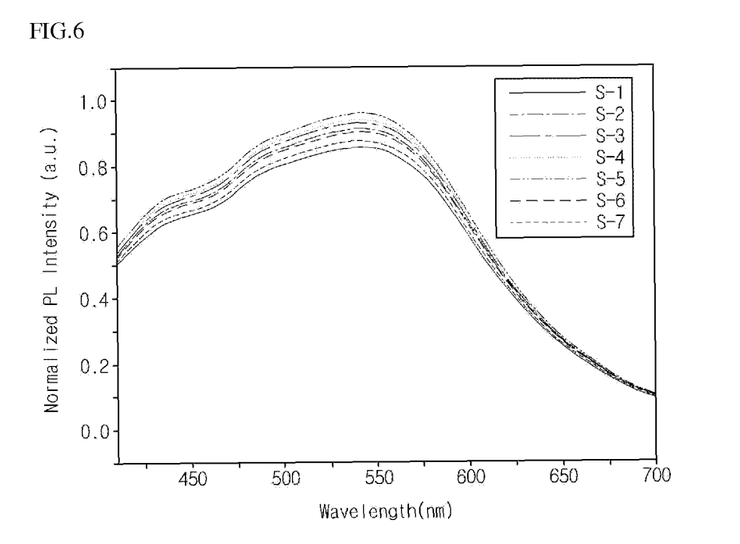
FIG. 6 is a graph showing the comparison between characteristic data of excitation wavelengths varying depending on the compositional ratios of LaO in the phosphor according to the embodiment.

FIG. 5 is a graph showing the spectrums of the light emitting wavelengths of phosphors in experimental examples S-1 to S-7 according to the values of x and y, resulting from $La_xO_ySi_6Al_4N_{12}:Ce^{3+}$ which is a compositional formual of the phosphor according to the embodiment. FIG. 6 is a graph showing the spectrums of the excitation wavelengths of the phosphors in the experimental examples S-1 to S-7 according to the values of x and y, resulting from $La_xO_ySi_6Al_4N_{12}:Ce^{3+}$ which is the compositional formual of the phosphor according to the embodiment. In this case, x may be in the range of $2 \leq x \leq 8$ and y may be in the range of $3 \leq y \leq 12$.

TABLE 1

Table 1 shows data obtained by experimenting light emitting characteristics according to the ratios of La to O in the light emitting device including the phosphor according to the embodiment.

| Experimental Example | Composition | Relative PL intensity (%) | Central Wavelength (%) |
| --- | --- | --- | --- |
| S-1 | $La_2O_3Si_6Al_4N_{12}$ | 89 | 465 |
| S-2 | $La_3O_{4.5}Si_6Al_4N_{12}$ | 95 | 467 |
| S-3 | $La_4O_6Si_6Al_4N_{12}$ | 97 | 468 |
| S-4 | $La_5O_{7.5}Si_6Al_4N_{12}$ | 98 | 472 |
| S-5 | $La_6O_9Si_6Al_4N_{12}$ | 100 | 473 |
| S-6 | $La_7O_{10.5}Si_6Al_4N_{12}$ | 94 | 470 |
| S-7 | $La_8O_{12}Si_6Al_4N_{12}$ | 91 | 470 |

Referring to FIG. 5, in the light emitting wavelength of the light emitting chip, the central wavelength of 400 nm is used as the excitation wavelength. The spectrums of the light emitting wavelengths of the phosphors having $La_xO_ySi_6Al_4N_{12}:Ce^{3+}$ according to the ratios of the ratios of La to O represent the PL (photoluminescence) intensity (%) of the relative central wavelength corresponding to 89% or more on the basis of the PL intensity of $La_6O_9Si_6Al_4N_{12}$. In particular, phosphors representing the PL intensity of 95% or more may include compositions of $La_3O_{4.5}Si_6Al_4N_{12}$, $La_4O_6Si_6Al_4N_{12}$, $La_5O_{7.5}Si_6Al_4N_{12}$, and $La_6O_9Si_6Al_4N_{12}$. Further, phosphors emitting light at the central wavelength in the range of 465 nm to 475 nm, in particular, having the central wavelength of 470 nm or more may include $La_5O_{7.5}Si_6Al_4N_{12}$, $La_6O_9Si_6Al_4N_{12}$, $La_7O_{10.5}Si_6Al_4N_{12}$, and $La_8O_{12}Si_6Al_4N_{12}$. The PL intensity of the central wavelength and the light emitting wavelength according to the compositions may be varied according to the excitation wavelengths.

Referring to FIG. 6, when the excitation wavelength is the central wavelength in the range of 300 nm to 400 nm, in detail, 350 nm to 370 nm, the highest PL intensity is represented. In particular, phosphors including compositions of $La_3O_{4.5}Si_6Al_4N_{12}$, $La_4O_6Si_6Al_4N_{12}$, $La_5O_{7.5}Si_6Al_4N_{12}$, and $La_6O_9Si_6Al_4N_{12}$ represent high PL intensities.

Figure 7:
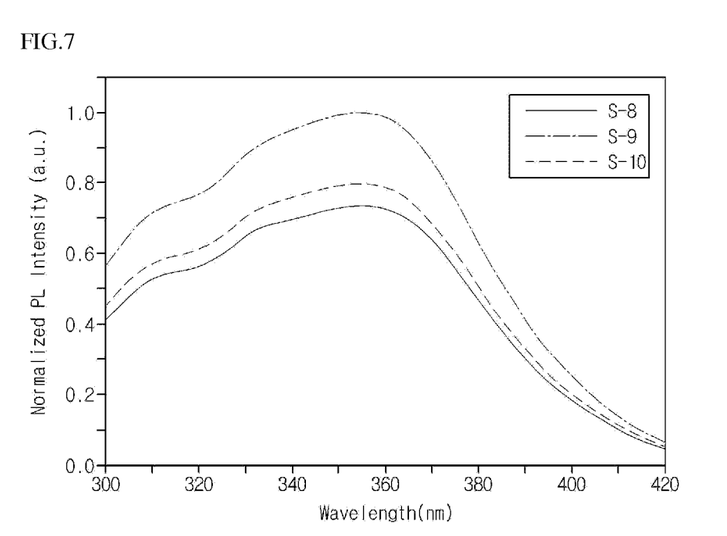
FIG. 7 is a graph showing the comparison between characteristic data of light emitting wavelengths depending on contents of Ce in the phosphor according to the embodiment.
Figure 8:
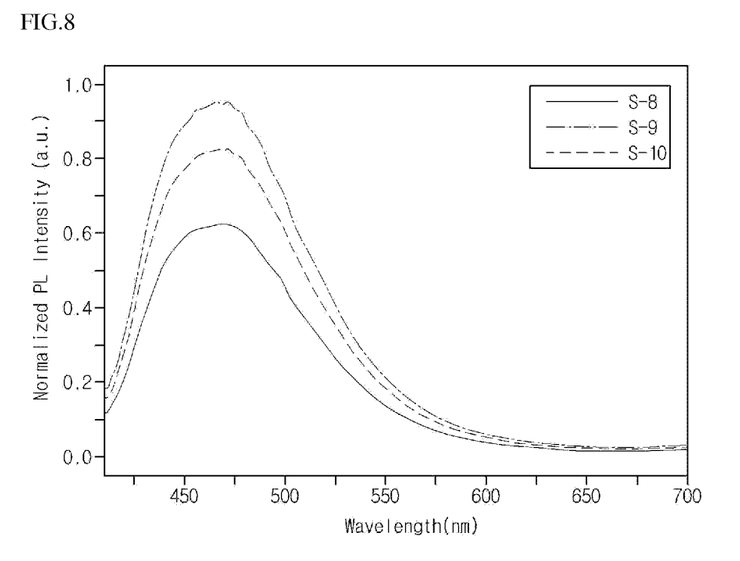
FIG. 8 is a graph showing the comparison between characteristic data of excitation wavelengths depending on contents of Ce in the phosphor according to the embodiment.

FIG. 7 is a graph showing light emitting wavelengths in experimental examples S-8, S-9, and S-10 depending on the contents of Ce of the phosphors according to the embodiment, and FIG. 8 is a graph showing light emitting wavelengths in experimental examples S-8, S-9, and S-10 depending on the contents of Ce of the phosphors according to the embodiment

TABLE 2

Table 2 shows the light emitting wavelength data representing the relative PL intensities varying depending on the contents of Ce in the phosphors according to the embodiment.

| Experimental Example | Composition | Content of Ce | Relative PL intensity (%) |
| --- | --- | --- | --- |
| S-8 | $La_6O_9Si_6Al_4N_{12}$ | 0.25 | 72 |
| S-9 | $La_6O_9Si_6Al_4N_{12}$ | 0.5 | 100 |
| S-10 | $La_6O_9Si_6Al_4N_{12}$ | 0.75 | 85 |

In FIG. 7, in the light emitting wavelength of the light emitting chip, the central wavelength of 400 nm is used as the excitation wavelength. FIG. 7 shows the experimental examples depending on the values of z in phosphors having the composition formula of $La_6O_9Si_6Al_4N_{12}:Ce^{3+}_z$. In this case, z is in the range of $0.25 \leq z \leq 0.75$, and light is emitted with the central wavelength in the range of 465 nm to 475 nm depending on the values of z. In particular, when z is 0.5, experimental example S-9 represents the intensity of 0.9 or more. FIG. 8 is a graph in which the excitation wavelength represents the highest PL intensity at the central wavelength in the range of 300 nm to 400 nm, in detail, the range of 350 nm to 370 nm in $La_6O_9Si_6Al_4N_{12}:Ce^{3+}_z$.

It can be understood that the blue phosphor of $La_xO_ySi_6Al_4N_{12}:Ce^{3+}$ according to the embodiment uses the excitation wavelength of 400 nm or less, in detail, the excitation wavelength in the range of 350 nm to 370 nm, and represents the highest intensity at the central wavelength in the range of 465 nm to 475 nm. In order to realize a white LED by using the blue phosphor, the blue phosphor according to the embodiment, the red phosphor, and the green phosphor may be applied onto a UV LED chip, or the blue phosphor and the yellow phosphor may be applied onto the UV LED chip. Alternatively, after the blue phosphor is applied onto the UV LED chip, green and red LED chips may be used. Accordingly, the light emission intensity may be improved by using the blue phosphor.

Figure 9:
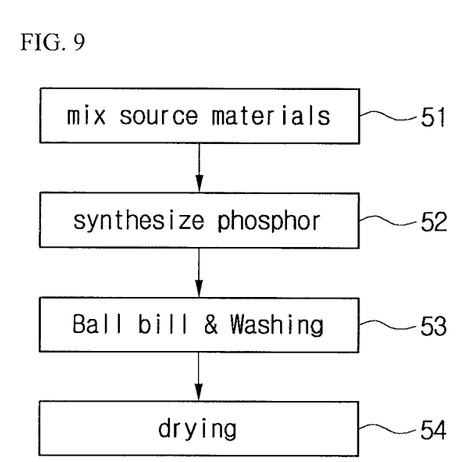
FIG. 9 is a flowchart showing the process of preparing the phosphor according to the embodiment.

FIG. 9 is a flowchart showing a scheme of preparing a phosphor according to the embodiment.

Referring to FIG. 9, after measuring source materials such as $La_2O_3$, $Si_3N_4$, AlN, and $CeO_2$ for the phosphor suitably for the compositional ratio of LaSiAlON, the source materials are mixed in an agate mortar by using a solvent (step 51). In this case, regarding the compositional ratio of the phosphor, the values of x and y may be changed with the change of the compositional ratio of LaO in the compositional formula of $La_xO_ySi_6Al_4N_{12}:Ce^{3+}_z$. In the compositional formula, x is in the range of $2 < x < 8$, and y is in the range of $3 < y < 12$. Regarding to the range of z, the intensity of the light emitting wavelength may be changed depending on the range of z. The z may be optimized in the range of $0.25 < z < 0.75$.

After the source materials for the phosphor have been mixed, the phosphor is synthesized at a synthetic atmosphere, in which a synthetic temperature is in the range of 1300° C. to 1500° C., and a gas flow rate is in the range of 400 cc to 2000 cc per minute, while changing the ratio of the $H_2/N_2$ mixed gas in the range of 5% to 20%/95%-~80% (step 52). For example, the phosphor may be synthesized at the temperature of 1400° C. for 6 hours with the gas ratio of $H_2$-10%/$N_2$-90% at the gas flow rate corresponding to 1000 cc/minute.

The synthesized phosphor is subject to a ball mill process and a washing process by using zirconia and a glass ball, and then subject to a dry process (steps 53 and 54). The dry process is performed for about 24 hours in an oven having the temperature of 100° C. (step 54).

The synthesized phosphor is subject to a ball mill process and a washing process by using zirconia and a glass ball, and then subject to a dry process (steps 53 and 54). The dry process is performed for about 24 hours in an oven having the temperature of 100 (step 54).

Then, the prepared phosphor may be analyzed in terms of excitation and light emitting characteristics through a PL analysis scheme. The LaSiAlON-based phosphor may be prepared by changing a preparation condition, and the prepared phosphor has the characteristic of a blue phosphor in the central wavelength in the range of about 465 nm to about 463 nm In this case, excited light has a wavelength in the range of 300 nm to 400 nm, and the light emitting wavelength having the maximum intensity is represented at the excitation wavelength in the range of 350 nm to 370 nm.

The phosphor may be prepared through a solid phase reaction scheme. In addition, a nitride phosphor or an acid nitride phosphor may be synthesized at the high-temperature and high-pressure condition, and the LaSiAlON-based phosphor may be synthesized even at the low-temperature and low-pressure condition as well as the high-temperature and high-pressure condition.

Since the LaSiAlON-based phosphor emits light at a blue region, a UV LED chip and phosphors having red and green regions are used together so that the white light emitting device can be realized.

The light emitting device according to the embodiment may be applied to a lighting system. The lighting system has a structure in which plurality of light emitting devices are arrayed. The lighting system may include a display device shown in FIGS. 10 and 11, a lighting device shown in FIG. 12, a lighting lamp, a signal lamp, a headlight of a vehicle, or an electric signboard.

Figure 10:
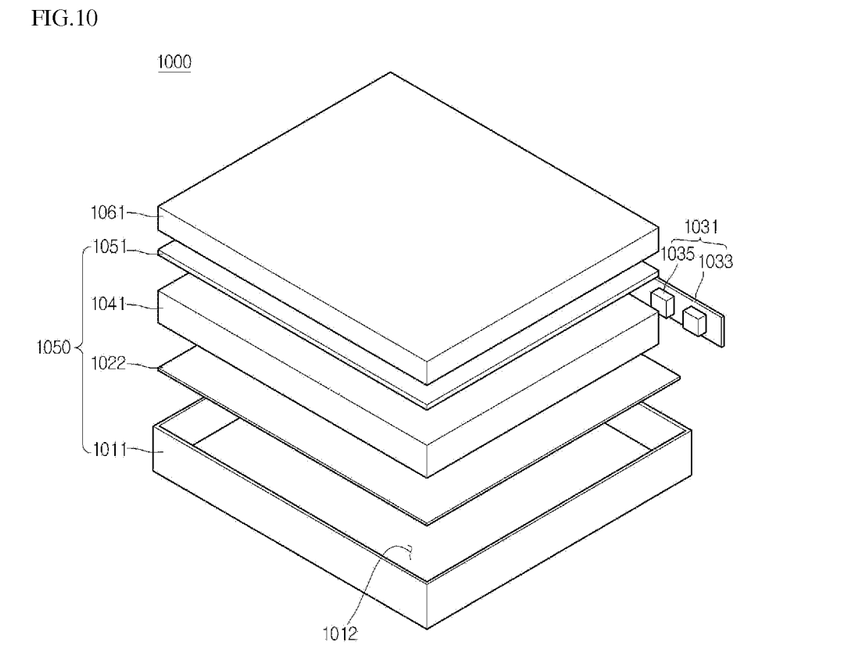
FIG. 10 is a perspective view showing a display device having the light emitting device according to the embodiment.

FIG. 10 is an exploded perspective view showing a display device having the light emitting device according to the embodiment.

Referring to FIG. 10, a display device 1000 according to the embodiment may include a light guide plate 1041, a light emitting module 1031 to supply the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 to receive the light guide plate 1041, the light emitting module 1031, and the reflective member 1022, but the embodiment is not limited thereto.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may include transparent material. For instance, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting module 1031 is disposed in at one side of the light guide plate 1041 to supply the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may include a substrate 1033 and light emitting devices 1035 according to the embodiments. The light emitting devices 1035 are arrayed on the substrate 1033 while being spaced apart from each other by the predetermined interval.

The substrate 1033 may include a printed circuit board (PCB) including a circuit pattern (not shown). In addition, the substrate 1033 may include a metal core PCB (MCPCB) or a flexible PCB (FPCB) as well as a typical PCB, but the embodiment is not limited thereto. If the light emitting device 1035 is installed on the side of the bottom cover 1011 or on a heat dissipation plate, the substrate 1033 may be omitted. The heat dissipation plate partially makes contact with the top surface of the bottom cover 1011.

In addition, the light emitting devices 1035 are arranged on the substrate 1033 such that a light exit surface of the light emitting devices 1035 is spaced apart from the light guide plate 1041 by a predetermined interval, but the embodiment is not limited thereto. The light emitting devices 1035 may directly or indirectly supply the light to a light incident surface, which is one side of the light guide plate 1041, but the embodiment is not limited thereto.

The reflective member 1022 may be provided below the light guide plate 1041. The reflective member 1022 reflects the light, which travels downward through the bottom surface of the light guide plate 1041, upward, thereby improving the brightness of a light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving part 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other and include a transparent material, and a liquid crystal layer disposed between the first and second substrates. A polarizing plate can be attached to at least one surface of the display panel 1061, but the embodiment is not limited thereto. The display panel 1061 displays information by a light passing through an optical sheet 1051. The display apparatus 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one of a diffusion sheet, a horizontal and vertical prism sheet, and a brightness enhanced sheet. The diffusion sheet diffuses the incident light, the horizontal and vertical prism sheet concentrates the incident light onto the display panel, and the brightness enhanced sheet improves the brightness by reusing the lost light. In addition, a protective sheet may be provided on the display panel 1061, but the embodiment is not limited thereto.

The light guide plate 1041 and the optical sheet 1051 can be provided on the light path of the light emitting module 1031 as optical members, but the embodiment is not limited thereto.

Figure 11:
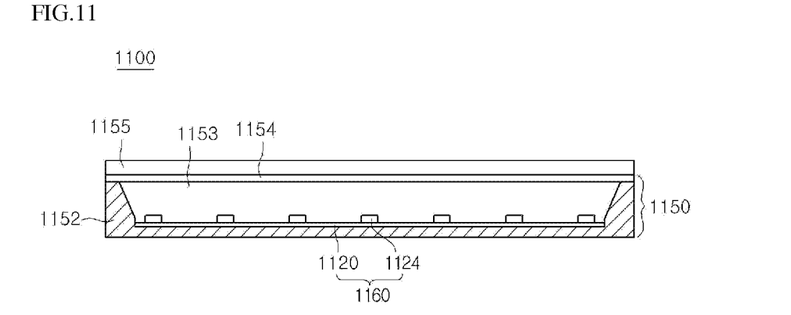
FIG. 11 is a perspective view showing the display device having the light emitting device according to the embodiment.

FIG. 11 is a view showing the display device having the light emitting device according to the embodiment.

Referring to FIG. 11, the display apparatus 1100 includes a bottom cover 1152, a substrate 1120 on which the light emitting devices 1124 are arrayed, an optical member 1154, and a display panel 1155.

The substrate 1120 and the light emitting device 1124 may constitute the light emitting module 1160. In addition, the bottom cover 1152, at least one light emitting module 1160, and the optical member 1154 may constitute the light unit 1150. The bottom cover 11152 may include a receiving part 1153, but the embodiment is not limited thereto. The light emitting module 1160 includes the substrate 1120 and a plurality of light emitting devices 1124 arranged on the substrate 1120.

The optical member 1154 may include at least one of a lens, a light guide plate, a diffusion sheet, a horizontal and vertical prism sheet, and a brightness enhanced sheet. The light guide plate may include PC or PMMA (Poly methyl methacrylate). The light guide plate may be omitted. The diffusion sheet diffuses the incident light, the horizontal and vertical prism sheet concentrates the incident light onto the display panel, and the brightness enhanced sheet improves the brightness by reusing the lost light.

The optical member 1154 is provided on the light source module 1160. The optical member 1154 provides the light emitted from the light source module 1150 as a surface light source, or diffuses or concentrates the light.

Figure 12:
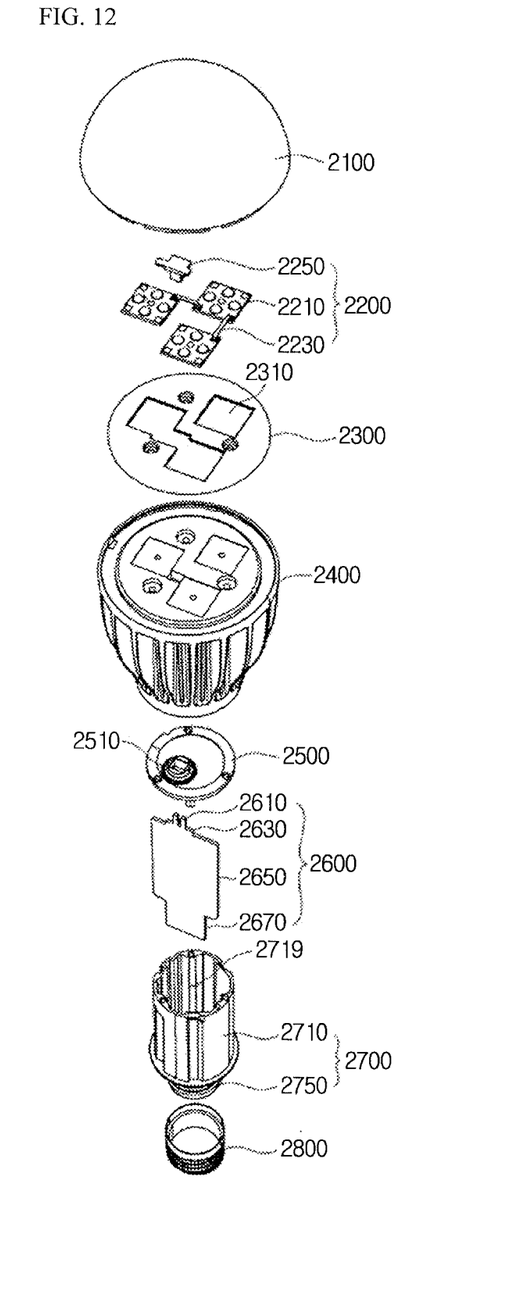
FIG. 12 is an exploded perspective view showing a lighting device having a light emitting device according to the embodiment.

FIG. 12 is an exploded perspective view showing a lighting device having the light emitting device according to the embodiment.

Referring to FIG. 12, the lighting system according to the embodiment may include a cover 2100, a light source module 2200, a radiator 2400, a power supply part 2600, an inner case 2700, and a socket 2800. The lighting device according to the embodiment may further include at least one of a member 2300 and a holder 2500. The light source module 2200 may include the light emitting device according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 2300 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting device according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives and radiates heats from the light source module 2200 and the power supply part 2600.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion of the power supply part 2600.

The power supply part 2600 processes or converts an electric signal received from the outside and provides the processed or converted electric signal to the light source module 2200. The power supply part 2600 is received in a receiving groove 2719 of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to the socket 2800.

The inner case 2700 may include a molding part therein together with the power supply part 2600. The molding part is prepared by hardening molding liquid, and the power supply part 2600 may be fixed inside the inner case 2700 by the molding part.

According to the embodiment, a blue phosphor having novel composition and a light emitting device including the same can be provided.

In addition, according to the embodiment, a phosphor having improved reliability and representing high brightness and a light emitting device including the same can be provided.

Further, according to the embodiment, a phosphor representing high luminescence intensity and a light emitting device including the same can be provided.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A phosphor expressed by a composition formula of $La_xO_ySi_6Al_4N_{12}:Ce^{3+}_z$,
   wherein O comprises oxygen, and
   the x is in a range of $2 \leq x \leq 8$, the y is in a range of $3 \leq y \leq 12$, and the z is in a range of $0 < z \leq 0.75$ to emit a central wavelength in the blue range.

2. The phosphor of claim 1, wherein the phosphor has a composition formula of $La_6O_9Si_6Al_4N_{12}:Ce^{3+}_z$ or $La_4O_6Si_6Al_4N_{12}:Ce^{3+}_z$.

3. The phosphor claim 1, wherein the central wavelength is in a range of 460 nm to 475 nm.

4. The phosphor of claim 3, wherein the phosphor emits the central wavelength in the range of 460 nm to 475 nm with respect to an excitation wavelength in a range of 300 nm to 400 nm.

5. The phosphor of claim 2, wherein the phosphor emits the central wavelength in a range of 465 nm to 475 nm with respect to an excitation wavelength in a range of 350 nm to 370 nm.

6. The phosphor of claim 2, wherein the Ce is in a range of $0.25 \leq z \leq 0.75$ in the composition formula of the phosphor.

7. A phosphor expressed by a composition formula of $La_xO_ySi_6Al_4N_{12}:Ce^{3+}_z$,
   wherein the O comprises oxygen,
   the x is in a range of $2 \leq x \leq 8$, the y is in a range of $3 \leq y \leq 12$, and the z is in a range of $0.25 < z \leq 0.75$, and
   the phosphor emits a blue light with respect to an excitation wavelength in a range of 300 nm to 400 nm.

* * * * *